United States Patent [19]
Uchida et al.

[11] Patent Number: 6,060,748
[45] Date of Patent: May 9, 2000

[54] SEMICONDUCTOR INTEGRATED CIRCUIT DEVICE USING A SILICON-ON-INSULATOR SUBSTRATE

[75] Inventors: Ken Uchida, Kawasaki; Akira Toriumi, Yokohama; Akiko Ohata, Tokyo; Junji Koga, Yokohama, all of Japan

[73] Assignee: Kabushiki Kaisha Toshiba, Kawasaki, Japan

[21] Appl. No.: 08/997,508

[22] Filed: Dec. 23, 1997

[30] Foreign Application Priority Data

Dec. 26, 1996 [JP] Japan ................................. 8-357186

[51] Int. Cl.[7] .............................. H01L 25/00; H01L 29/00

[52] U.S. Cl. .............................. 257/347; 257/25; 257/508

[58] Field of Search ........................... 257/14, 500, 501, 257/502, 503, 508, 24, 25, 347

[56] References Cited

U.S. PATENT DOCUMENTS

| | | | |
|---|---|---|---|
| 5,097,314 | 3/1992 | Nakagawa et al. | 257/500 |
| 5,461,253 | 10/1995 | Tsuruta et al. | 257/501 |
| 5,627,399 | 5/1997 | Fujii | 257/500 |
| 5,754,077 | 5/1998 | Ohata et al. | 327/566 |

*Primary Examiner*—Donald L. Monin, Jr.
*Attorney, Agent, or Firm*—Oblon, Spivak, McClelland, Maier & Neustadt, P.C.

[57] ABSTRACT

A semiconductor integrated circuit (IC) device has a silicon-on-insulator substrate having a semiconductor substrate, an insulating film formed on the semiconductor substrate, and a silicon layer formed on the insulating film. The semiconductor IC device includes at least one semiconductor device formed on the semiconductor substrate, and at least one semiconductor device formed on the silicon layer and operated with a power-supply voltage different from a power-supply voltage for the semiconductor device formed on the semiconductor substrate.

11 Claims, 10 Drawing Sheets

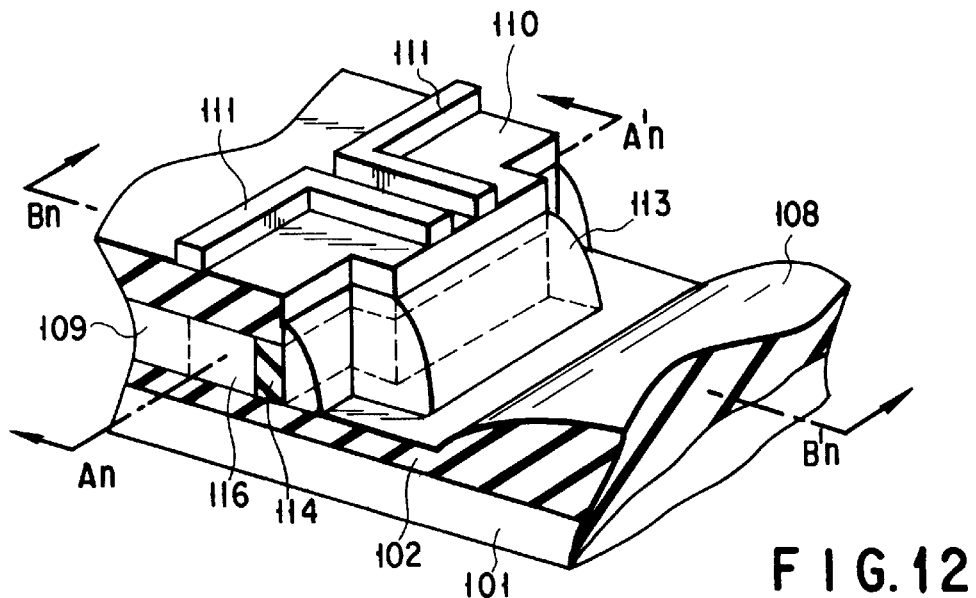
F I G. 12
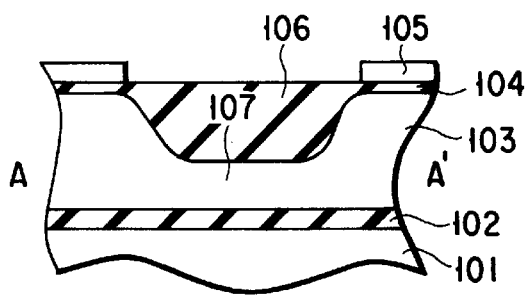
F I G. 13A
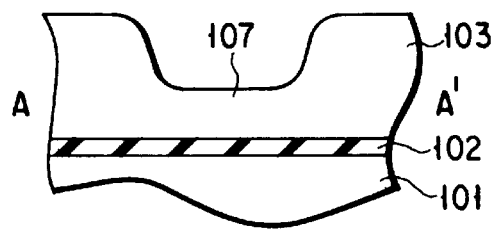
F I G. 13B
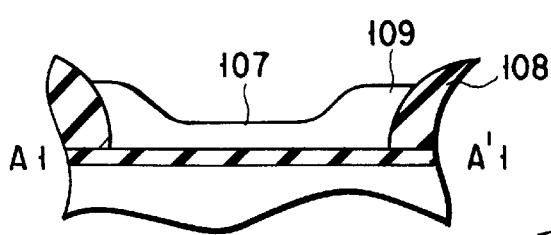
F I G. 13C
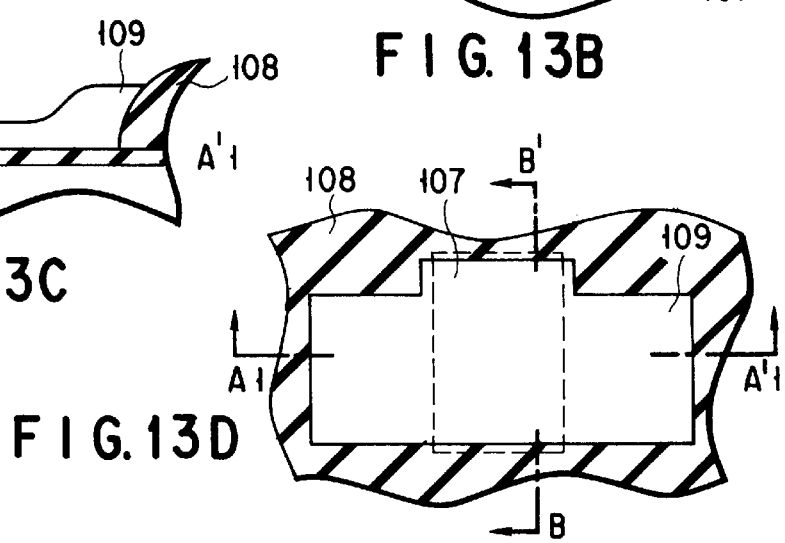
F I G. 13D

SEMICONDUCTOR INTEGRATED CIRCUIT DEVICE USING A SILICON-ON-INSULATOR SUBSTRATE

BACKGROUND OF THE INVENTION

The present invention relates to a semiconductor integrated circuit device using an SOI (Silicon-On-Insulator) substrate.

Recently, with development of device miniaturization techniques, a device called a single electron device such as a single electron transistor, which uses a charging effect of one electron, has been manufactured (for example, IEEE Trans. Magnetics Vol. MAG-23 pp. 1142–1145), and much attention has been paid to this device. The single electron device is an ultimate electronic device wherein one electron will be controlled, and it has an excellent feature of very low power consumption.

The minimum unit of the single electron transistor is a conductor island having two small tunnel junctions, and a current flowing across the junctions is controlled by an external potential capacitively coupled to the island. More specifically, a potential Vext of an external electrode which is capacitively coupled to a conductor island by capacitance Cext varies by about e/Cext. Thereby, the flow of electrons is turned on/off. When the sum of the capacitance viewed from the conductor island is C, an output voltage variation obtained by the single electron device and an applicable power supply voltage are about e/C, respectively. However, since the magnitude of C, which is obtainable, is on the order of 10 aF, the voltage variation which can be obtained is at most several mV. If the design dimensions are reduced to about $\frac{1}{10}$ or less, the voltage variation increases about 100 times or more. Even in consideration of modern miniaturization techniques, however, it appears very difficult to increase the output voltage over 100 mV. Single electron devices include, for example, so-called single electron transistors, turnstile devices, and devices having tunnel junctions arrayed one- or two-dimensionally. The single electron device is a generic name of devices having small tunnel junctions and utilizing an electron charging effect.

As has been described above, although the single electron device has an excellent feature of very low power consumption, the magnitude of a signal to be treated is much smaller than that in a conventional CMOS. Moreover, the tolerance for noise is strictly limited. Besides, only a power supply voltage of about several mV can be applied.

On the other hand, an MOS type field-effect transistor formed on a thin-film SOI has excellent sub-threshold characteristics and thus a threshold voltage can be decreased. In this transistor, a parasitic capacitance is small because of its structure. Furthermore, since a variation in threshold voltage due to a substrate bias voltage is small, the operation at low power-supply voltage is stabilized. Accordingly, a MOS type field-effect transistor (MOSFET) fabricated on the thin-film SOI has higher current drive and operational stability at low voltages than a MOSFET fabricated on a bulk Si. The MOSFET on the thin-film SOI is widely considered as a prospective next-generation device structure with low power consumption and high operation speed.

However, in the case of the MOSFET fabricated on the thin-film SOI, many problems are caused by a substrate floating effect, e.g. a power-supply voltage cannot be raised because of a degradation in source-drain breakdown voltage due to a latch-up caused by the substrate floating effect. It is known, in particular, that the degradation in source-drain breakdown voltage is very considerable in the nMOSFET.

As has been described above, a power-supply voltage of several mV is used in the single electron transistor and a power-supply voltage of about 1 to 2 V is used in the MOSFET on the thin-film SOI, while a power-supply voltage of about 3.3 V is generally adopted in the currently used CMOS, etc. In the 0.1 $\mu$m generation, it is expected that the power-supply voltage will be 1 V, but this value is far from the power-supply voltage of the single electron transistor.

The single electron device, as described above, is an ultimate device using fine processing techniques, and it can be operated with low power consumption. However, the amplitude of the signal treated in the single electron transistor is much smaller than that treated in the conventional CMOS, and therefore the tolerance for noise is much lower than that in CMOS. Besides, the single electron transistor has a disadvantage in that the power-supply voltage of the single electron transistor is much lower than that in the conventional CMOS.

On the other hand, the MOSFET fabricated on the thin-film SOI has excellent features of high-speed operations and lower power consumption. However, since the source-drain breakdown voltage deteriorates, a relatively lower voltage, as compared to the conventional CMOS, needs to be used as power-supply voltage. In particular, the source-drain breakdown voltage of the nMOS is more deteriorated than that of the pMOS.

BRIEF SUMMARY OF THE INVENTION

The object of the present invention is to provide a semiconductor integrated circuit device wherein a device such as a single electron device with a lower power-supply voltage than a CMOS device, i.e. a device with a low noise margin or an input/output signal level, and a device such as a conventional CMOS device with a high power-supply voltage, i.e. a device with a high noise margin or an input/output signal level, can be provided on the same substrate while their respective characteristics are not deteriorated.

The above object can be achieved by a semiconductor integrated circuit (IC) device having a silicon-on-insulator substrate comprising a semiconductor substrate, an insulating film formed on the semiconductor substrate, and a silicon layer formed on the insulating film, the semiconductor IC device comprising:

at least one semiconductor device formed on the semiconductor substrate; and at least one semiconductor device formed on the silicon layer and operated with a power-supply voltage different from a power-supply voltage for the semiconductor device formed on the semiconductor substrate.

The above object can also he achieved by a semiconductor integrated circuit (IC) device having a silicon-on-insulator substrate comprising a semiconductor substrate, an insulating film formed on the semiconductor substrate, and a silicon layer formed on the insulating film, the semiconductor IC device comprising:

at least one semiconductor device formed on the semiconductor substrate; and at least one single electron device formed on the silicon layer.

In this case, single electron devices include, for example, so-called single electron transistors, turnstile devices, and devises having tunnel junctions arrayed one- or two-dimensionally. The single electron device is a generic name of devices having small tunnel junctions and utilizing an electron charging effect.

The above object can also be achieved by a semiconductor integrated circuit (IC) device having a silicon-on-insulator substrate comprising a semiconductor substrate, an insulating film formed on the semiconductor substrate, and a silicon layer formed on the insulating film, the semiconductor IC device comprising:

at least one semiconductor device formed on the semiconductor substrate; and at least one MOS type field-effect transistor formed on the semiconductor substrate and including a gate insulating film and a channel region in the semiconductor substrate beneath the insulating film.

According to the semiconductor IC device of the present invention, the semiconductor device formed on the semiconductor substrate can completely be electrically isolated from the semiconductor device formed on the silicon layer. Therefore, a device such as a single electron device with a lower power-supply voltage than a CMOS device (a device with a low noise margin or an input/output signal level) and a device such as a conventional CMOS device with a high power-supply voltage (a device with a high noise margin or an input/output signal level) can be provided on the same substrate while their respective characteristics are not deteriorated. Specifically, in the circuit block including the semiconductor device formed on the silicon layer, the characteristics of this device can be exhibited to the maximum with use of a power-supply voltage lower than that for the conventional CMOS. On the other hand, CMOS formed on the semiconductor substrate is provided with a separate power-supply voltage optimal for CMOS.

This semiconductor integrated circuit device is fabricated in the following manner.

A first region of an SOI substrate comprising a semiconductor substrate, an insulating film formed on the semiconductor substrate and a silicon layer formed on the insulating film is masked, and those portions of the silicon layer and insulating film, which are located in a second region other than the first region, are removed. The semiconductor substrate in the second region is partially oxidized, and a LOCOS (Local Oxidation of Silicon) device isolation region or STI (Shallow Trench Isolation) device isolation region is formed only in the second region. Then, a device isolation region is provided in the first region. This device isolation region is a LOCOS device isolation region formed by partially oxidizing the silicon layer of the first region, a mesa type device isolation region formed by partially removing the silicon layer in the first region, or after the mesa type device region formed in the first region, an insulation film deposited on the mesa type device isolation region, and CMP (Chemical Mechanical Polishing) adapted to the film, thereby STI device region is obtained. Thereafter, semiconductor devices are formed in the first and second regions.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 shows an example of the structure of a single electron transistor;

FIGS. 13A to 13D show part of the steps of manufacturing the single electron transistor shown in FIG. 12;

DETAILED DESCRIPTION OF THE INVENTION

The present invention relates to a semiconductor integrated circuit (IC) device having a silicon-on-insulator (SOI) substrate comprising a semiconductor substrate, an insulating film formed on the semiconductor substrate, and a silicon layer formed on the insulating film. The present invention is characterized in that one semiconductor device is formed on the semiconductor substrate and another semiconductor device is formed on the silicon layer. The semiconductor device formed on the silicon layer operates at a power-supply voltage different from a power-supply voltage applied to the semiconductor device formed on the semiconductor substrate.

A preferred embodiment of the semiconductor IC device according to the present invention having the above feature will now be described with reference to FIG. 1. Specifically, although the semiconductor IC device of this embodiment has a single electron device which is very sensitive to variation in external voltage or ambient temperature, an external bus having a capacity of several pF or more can be driven at a level of several V.

Figure 1:
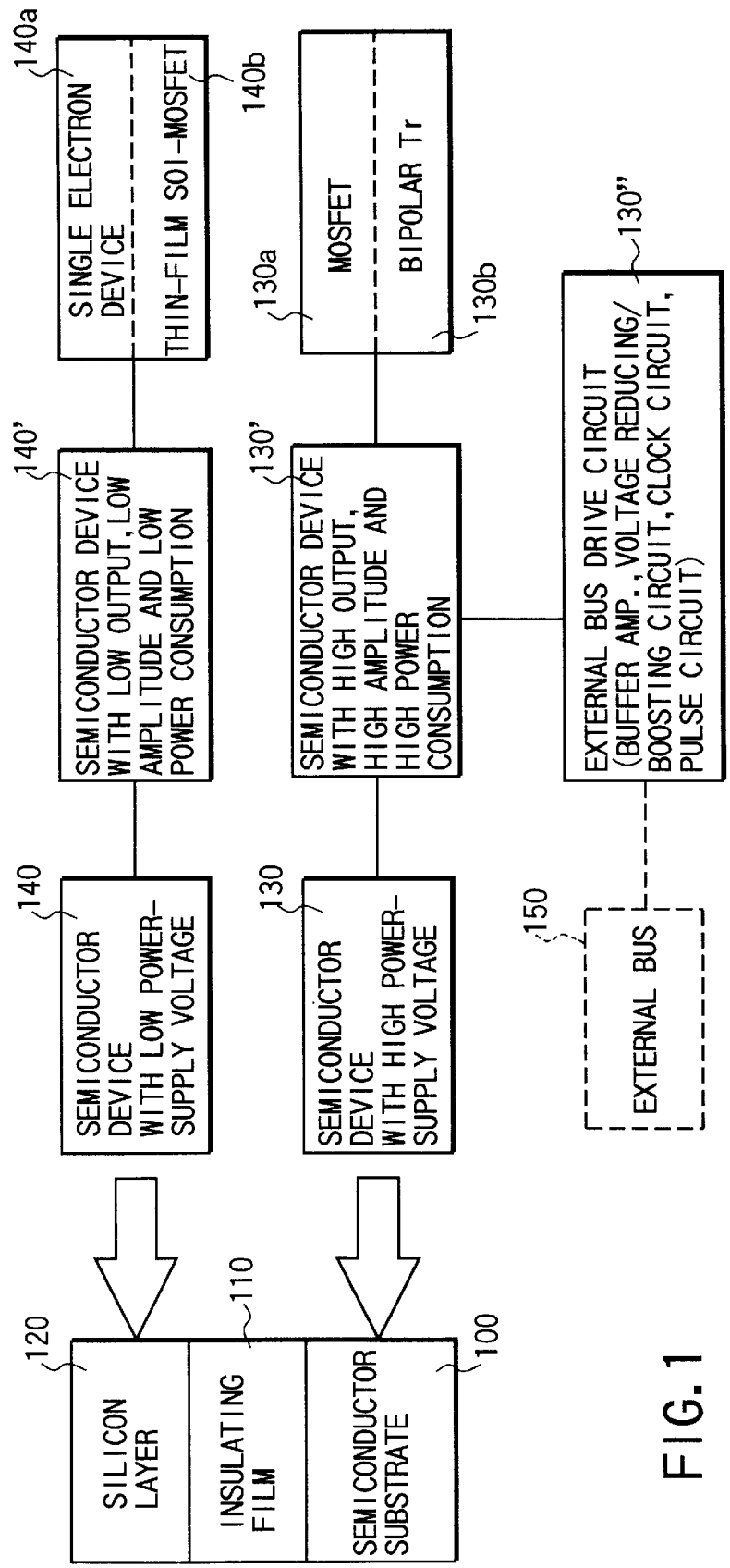
FIG. 1 schematically shows the structure of a semiconductor integrated circuit (IC) device according to the present invention.

As is shown in FIG. 1, in the semiconductor IC device of this embodiment, a semiconductor device 130 (130'), which is an external bus drive circuit 130" such as a buffer circuit for driving an external bus 150, a step-down voltage circuit for regulating an external voltage suitable for a semiconductor device, a step-up voltage circuit for boosting an output of a semiconductor device by an external voltage, a clock circuit causing a lot of noise and/or a pulse circuit, is formed on a semiconductor substrate 100. The semiconductor device 130' comprises an MOS type field-effect transistor 130a and a bipolar transistor 130b, etc. On the other hand, a semiconductor device 140 (140'), which constitutes a functional block having a very low power consumption and high-level functions and including a single electron device 140a and a thin-film SOI-MOSFET 140b, is formed on a silicon layer 120. The semiconductor device 130 formed on the semiconductor substrate 100 is the semiconductor device 130' with a high output, a high amplitude and a high power consumption. The semiconductor device 140 formed on the silicon layer 120 is the semiconductor device 140' with a low output, a low amplitude and a low power consumption.

With this structure, even if the external bus 150 is driven at a level of several volts and the potential of the semiconductor substrate 100 varies, the coupling capacitance between a conductor island of the single electron device 140a and the semiconductor substrate 100 decreases extremely due to the presence of the insulating film 110. Accordingly, a bit error does not occur in the single electron device 140a of semiconductor device 140 (140').

Even if the temperature of the semiconductor substrate 100 rises due to power consumption caused by the activation of the external bus 150, the single electron device 140a of semiconductor device 140 (140') is also thermally separated from the semiconductor substrate 100 by the insulating film 110 on the semiconductor substrate 100. Thus, the rise in temperature can be remarkably suppressed, and no bit error occurs.

In this case, since the semiconductor device 130 on semiconductor substrate 100 has a sufficiently higher thermal capacitance than the semiconductor device 140 on silicon layer 120, it is desirable to make the power-supply voltage of the semiconductor device 140 on silicon layer 120 lower than that of the semiconductor device 130 on semiconductor substrate 100, thereby reducing power consumption. This is obvious, too, in consideration of the fact that the conventionally used external power-supply voltage of 3.3 V or 1.5 V will certainly be used in the future, although the semiconductor device 140 on silicon layer 120 exhibits a high performance with a power-supply voltage of about 1 V or less.

In order to further suppress bit errors of the single electron device 140a of semiconductor device 140 so that the rate of error occurrence closer approaches nil, it is preferable to increase the thickness of the insulating film 110 by a degree by which a product of a coupling capacitance between the conduction island of single electron device 140a and semiconductor substrate 100 and a maximum voltage variation Vext of semiconductor substrate 100 becomes much sufficiently lower than an elementary charge.

Needless to say, the single electron device 140a may be of any type if it has small tunnel junctions and utilizes an electron charging effect. The single electron device 140a is, for example, a single transistor, a turnstile device, or a device having small tunnel junctions arrayed one- or two-dimensionally.

Similarly, with reference to FIG. 1, another embodiment of the semiconductor IC device according to the present invention will now be described. The operation speed of this device is higher than that of the above-described semiconductor IC device, and the power consumption of this device is further reduced.

In this semiconductor IC device, the single electron device 140a and MOSFET 140b are formed on the silicon layer 120, and the semiconductor device 130 is formed on the semiconductor substrate 100.

In the MOSFET 140b including the thin-film silicon layer as a channel portion has less coupling capacitance and wiring capacitance and higher sub-threshold characteristics than the MOSFET 130a formed on the semiconductor substrate 100. Therefore, the threshold voltage can be further lowered. If an equal power-supply voltage is used, the drive current is increased and also the operation speed increased.

Accordingly, if the circuit 130" for driving the external bus 150, lowering the external power-supply voltage and generating clock signals is formed on the semiconductor substrate 100 and if the MOSFET 140b constituting a high-speed logic, etc. and the single electron device 140a constituting a relatively low-speed operation circuit or a circuit having a low power-consumption is strongly required, are formed on the silicon layer 120, a semiconductor IC circuit having the best performance can be provided.

In this case, in order to make the best use of low power-consumption properties of the single electron device 140a, it is desirable to reduce the power-supply voltage of the single electron device 140a to a minimum level and to gradually increase power-supply voltages to the MOSFET 140b on silicon layer 120 and the semiconductor device 130 on semiconductor substrate 100 in the order named.

With this structure, the single electron device 140a and the semiconductor device 130 on semiconductor substrate 100, which has a greatest voltage variation, are capacitive-coupled through the insulating film 110 on the semiconductor substrate 100. Although the coupling capacitance between the MOSFET 140b and single electron device 140a on silicon layer 120 is greater than that between the MOSFET 140b and semiconductor device 130 on semiconductor substrate 100, the power-supply voltage of the MOSFET 140b on silicon layer 120 can be set at about ½ to ⅕ of the power-supply voltage of the device on the semiconductor substrate 100. Accordingly, the limitations to the capacitance can be relaxed similarly. Therefore, as described above, if the power-supply voltages to the single electron device 140a, MOSFET 140b and semiconductor device 130 are set similarly with the above-described case, the power consumption, speed and reliability of the devices can be enhanced.

Since the single electron device 140a has a high output impedance, it is desirable that the device 140a be received by a device with a high input impedance, such as MOSFET 140b. In addition, in general, the single electron device 140a has a problem in that it has a low drive current and if the capacitance of the output node is large, the operation speed considerably decreases. Thus, in order to reduce the entire capacitance, it is better to connect the single electron device 140a to the MOSFET 140b on silicon layer 120 than to the MOSFET 130a on semiconductor substrate 100. This technique is also advantageous in view of the fact that the MOSFET 140b on silicon layer 120 can exhibit a higher drive current with a lower voltage.

Descriptions will now be given of various embodiments of the arrangement of the semiconductor device 130 formed on semiconductor substrate 100 and the semiconductor device 140 formed on silicon layer 120 in the semiconductor IC device using the SOI substrate.

Figure 2:
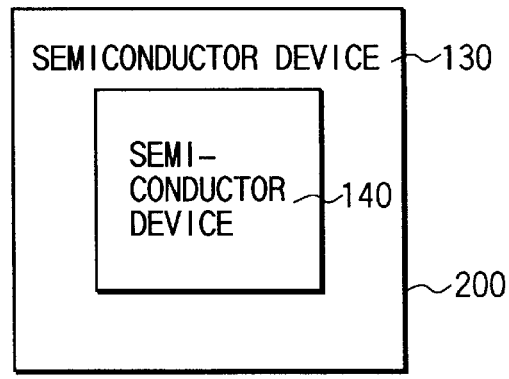
FIGS. 2 to 4 show preferred embodiments of the semiconductor IC device according to the invention.

In an embodiment shown in FIG. 2, a semiconductor device 130 is formed on a semiconductor substrate of a semiconductor IC device 200 using an SOI substrate, and a semiconductor device 140 is formed on a silicon layer formed on the semiconductor substrate.

Figure 3:
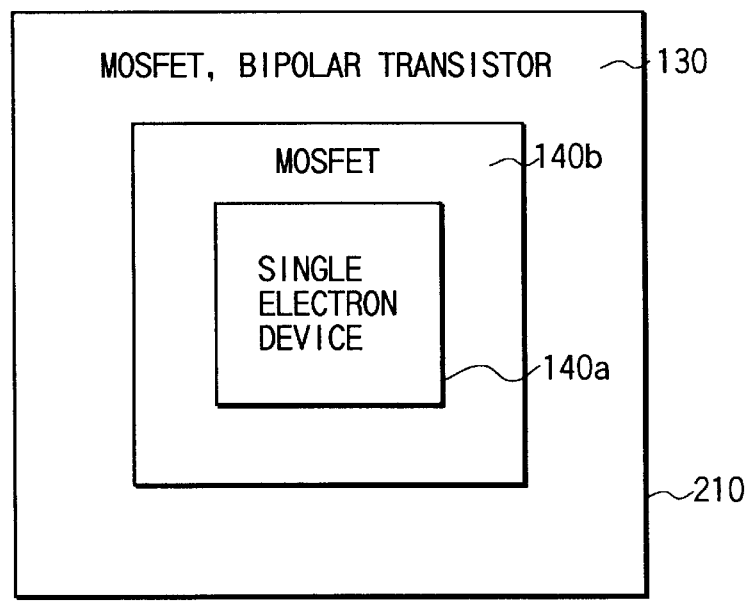

In an embodiment shown in FIG. 3, a semiconductor device 130, such as a MOSFET or a bipolar transistor, is formed on a semiconductor substrate of a semiconductor IC device 210 using an SOI substrate, a single electron device 140a is formed on a central portion of a silicon layer formed on an insulating film on the semiconductor substrate, and a MOSFET 140b is formed around an outer peripheral portion of the single electron device 140a.

Figure 4:
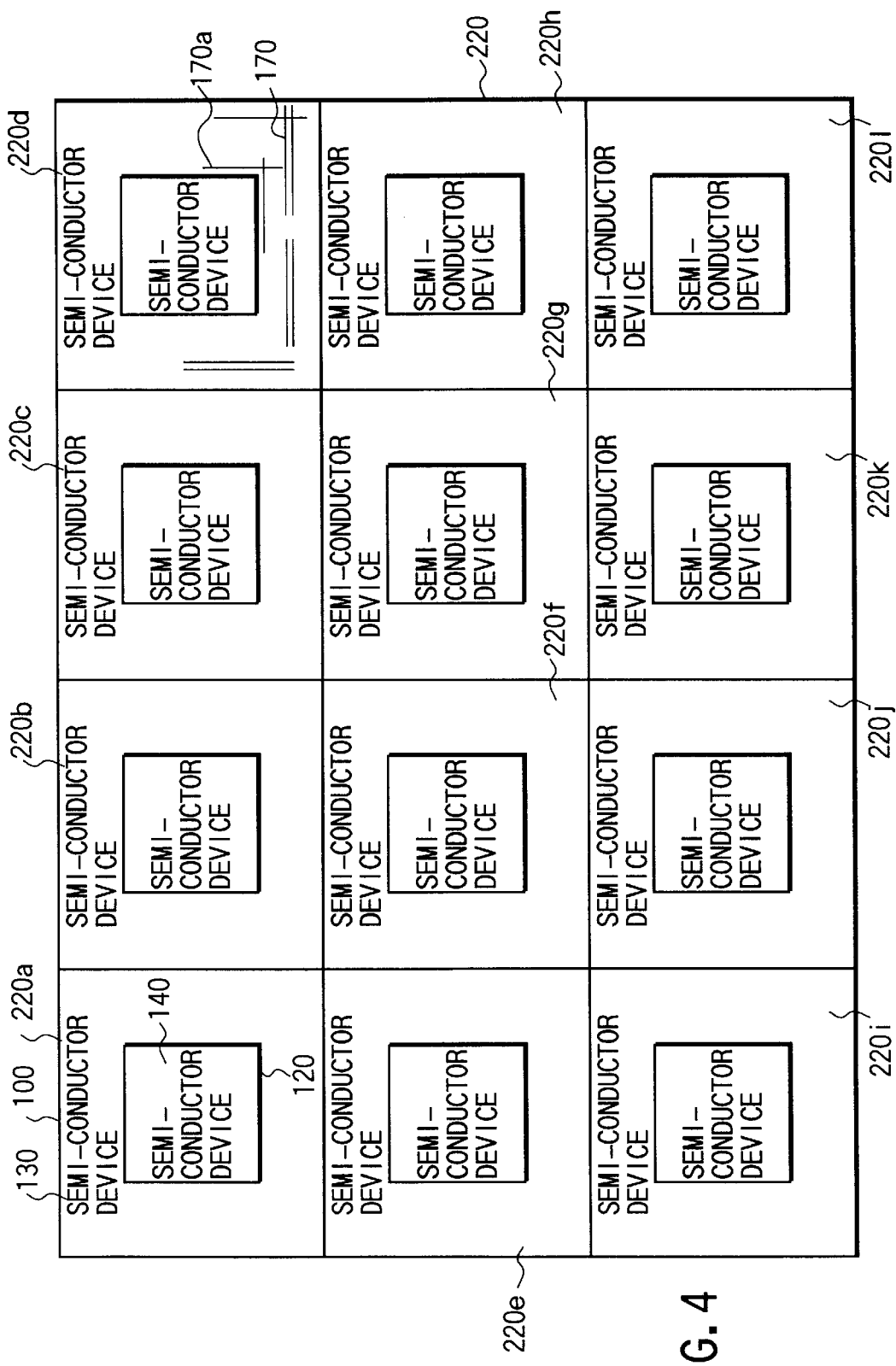

An embodiment shown in FIG. 4 relates to a semiconductor IC device 220 using an SOI substrate, which includes devices 220a to 220l similar to the devices of the semiconductor IC device 200 shown in FIG. 2. It is desirable that all wires 170, which are capacitively coupled to the single electron device 140a on silicon layer 120, be situated as far away as possible from the single electron device 140a so that the greater the maximum voltage variation in the wiring 170, the less the coupling capacitance. Accordingly, it is desirable that high-voltage power lines and wires 170a for connecting semiconductor devices 130 on semiconductor substrate 100 using a high power-supply voltage should not pass over the silicon layer 120.

Specifically, semiconductor devices 130 on the semiconductor substrate 100 are arranged around the semiconductor devices 140 formed on the silicon layer 120.

Figure 5:
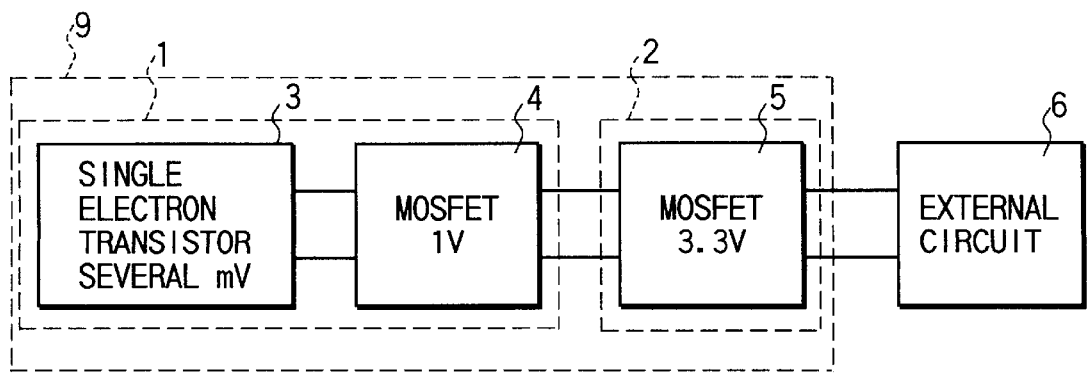
FIG. 5 is a block diagram schematically showing an example of the structure of the semiconductor IC device according to the invention.

Another preferred embodiment of the present invention will now be described. FIG. 5 is a block diagram schematically showing an example of the structure of the semiconductor IC device according to the invention. An SOI substrate 9, on which semiconductor devices are to be formed, generally has a first region 1 and a second region 2. A very-high-speed, a very-low-power-consumption, or a low-power-supply-voltage semiconductor device is mainly formed in the first region 1. Specifically, a high-functional circuit block such as a logic or a memory is formed in the first region 1. For example, a single electron device 3 and a MOSFET 4 are formed in the first region 1. These devices are formed on a surface silicon layer formed on a silicon substrate with a buried insulating layer interposed. A power-supply voltage of, e.g. several mV, is supplied to the single electron device 3, and a power-supply voltage of, e.g. 1 V, is supplied to the MOSFET 4. In other words, the power-supply voltage of the single electron device 3 is less than 1/100 that for the MOSFET. There may be no need to provide both the single electron device 3 and MOSFET 4, and only one of them may be provided. Semiconductor devices other than the single electron and MOSFET may be provided.

A high-output semiconductor device is mainly formed in the second region 2. An interface circuit block (including an input circuit, an output circuit or an input/output circuit) for an interface with an external circuit 6 is typically formed in the second region 2. For example, a MOSFET 5 is formed as a semiconductor device in the second region 2, and this is directly formed on the bulk Si substrate. A power-supply voltage of, e.g. 3.3 V, is supplied to the MOSFET 5. A semiconductor device other than the MOSFET may be provided.

The first region 1 and second region 2 are connected to each other. A signal input from the external circuit 6 is level-converted by the interface circuit provided in the second region 2, and then sent to the first region 1. A signal from the first region 1 is level-converted by the interface circuit provided in the second region 2 and then sent to the external circuit 6.

A specific example of the structure of the semiconductor IC circuit according to the present invention will now be described with reference to FIGS. 6 and 7. In this example, a CMOS inverter constituted by a MOSFET on the surface silicon layer and a conventional CMOS inverter on the bulk Si substrate are mounted in combination on the same SOI substrate.

Figure 6:
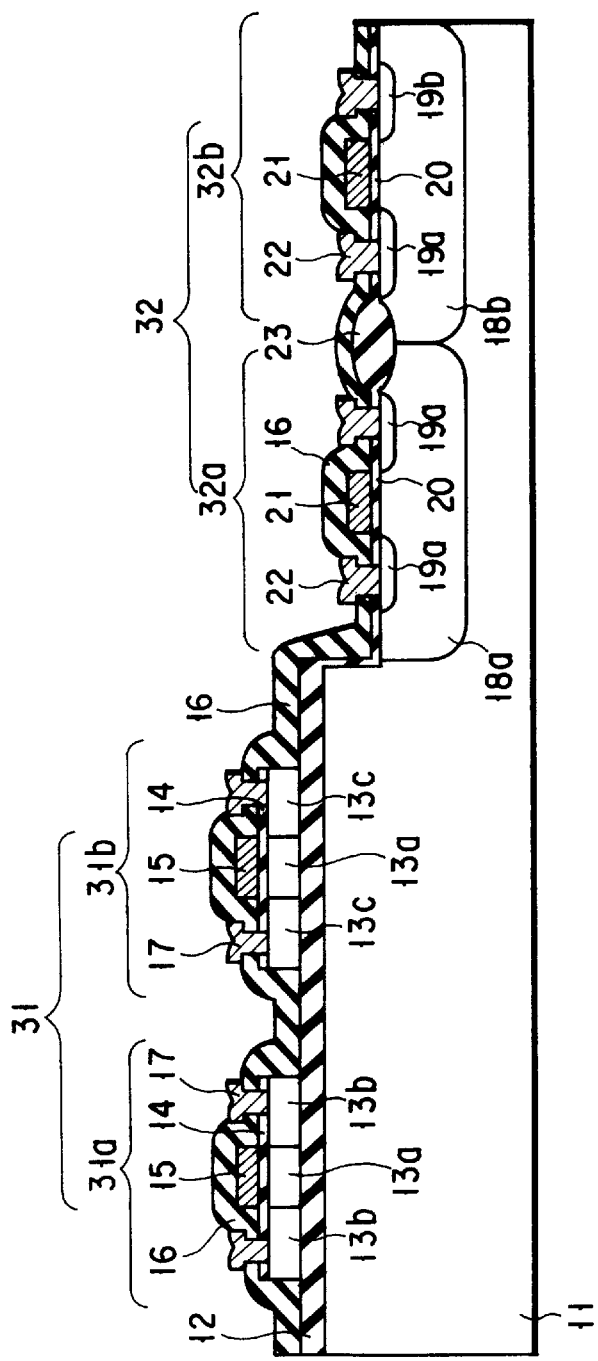
FIG. 6 shows an example of the specific structure of the semiconductor IC device according to the invention.

FIG. 6 is a cross-sectional view showing the structure of the semiconductor IC circuit. A buried insulating film 12 such as an $SiO_2$ film is formed on a bulk Si substrate 11. Non-doped silicon layers 13a serving as active layers of an nMOSFET 31a and a pMOSFET 31b, n+ silicon layers 13b serving as source/drain diffusion layers of the nMOSFET 31a, and p+ silicon layers 13c serving as source/drain diffusion layers of the pMOSFET 31b are formed in a surface silicon layer of a single crystal on the buried insulating film 12.

Gate electrodes 15 formed of, e.g. polysilicon are provided on gate insulating films 14 of the nMOSFET 31a and pMOSFET 31b. Wiring layers 17 of Al, etc. are formed to come in contact with the n+ silicon layers 13b, p+ silicon layers 13c and gate electrodes 15 through openings formed in inter-layer insulating films 16 of TEOS, etc.

The nMOSFET 31a and pMOSFET 31b, which are isolated by mesa type device isolation, are thus formed on the surface silicon layer formed on the bulk Si substrate 11 with the buried insulating film 12 interposed.

An nMOSFET 32a is formed in a p-well 18a, and a pMOSFET 32b is formed in an n-well 18b. N+ diffusion layers 19a are formed as source/drain diffusion layers of the nMOSFET 32a, and p+ diffusion layers 19b are formed as source/drain diffusion layers of the pMOSFET 32b.

Gate electrodes 21 formed of, e.g. polysilicon are provided on gate insulating films 20 of the nMOSFET 32a and pMOSFET 32b.

Wiring layers 22 of Al, etc. are formed to come in contact with the n+ diffusion layers 19a, p+ diffusion layers 19b and gate electrodes 21 through openings formed in inter-layer insulating films 16. The nMOSFET 32a and pMOSFET 32b are isolated by a LOCOS device isolation 23.

The nMOSFET 32a and pMOSFET 32b are formed on the bulk Si substrate 11 in the second region 32, and thus a conventional CMOS is constructed.

Figure 7:
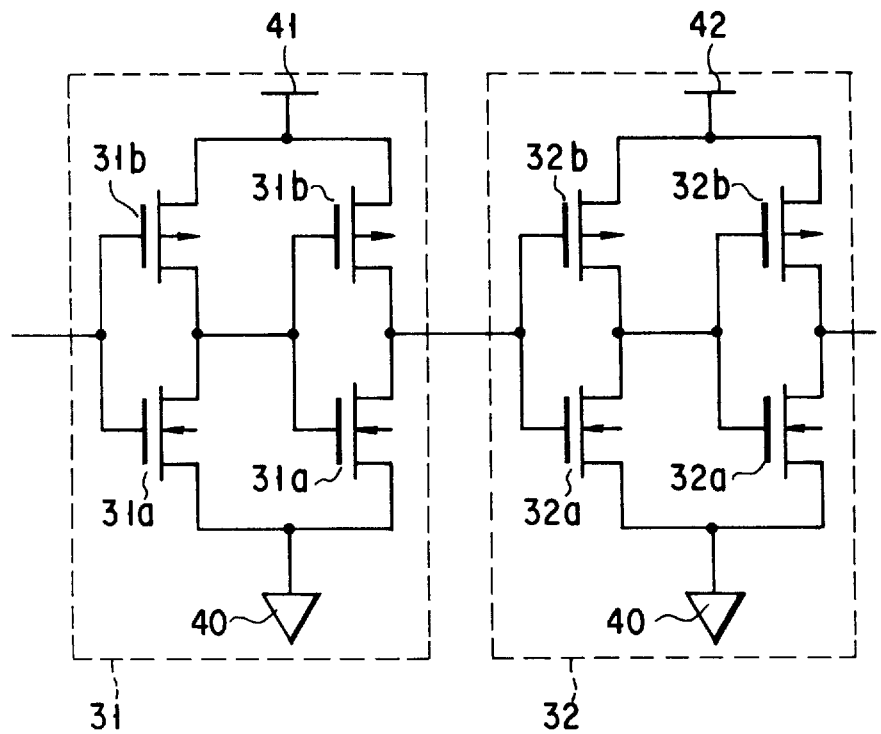
FIG. 7 shows an example of a circuit configuration obtained from the structure shown in FIG. 6.

FIG. 7 shows an example of a circuit configuration of the semiconductor IC circuit obtained from the structure shown in FIG. 6. Two CMOS inverters comprising the nMOSFETs 31a and pMOSFETs 31b, as shown in FIG. 6, are formed in the first region 31 (first circuit block). A power-supply voltage of, e.g. 1 V is applied between a reference potential section 40 and a power-supply section 41 of the CMOS inverters.

In the second region 32 (second circuit block), two CMOS inverters comprising the nMOSFETs 32a and pMOSFETs 32b, as shown in FIG. 6, are formed. A power-supply voltage of, e.g. 3.3 V is applied between the reference potential section 40 and a power-supply section 42 of the CMOS inverters.

In the thus obtained semiconductor IC circuit, an amplifying section with a very low power consumption and a high-speed operation is constructed in the first region 31 (first circuit block), and a high output is obtained in the second region 32 (second circuit block).

In the example shown in FIG. 7, the CMOS inverters formed in the first region 31 (first circuit block) are directly connected to the CMOS inverters formed in the second region 32 (second circuit block). In general, however, a level shifter for adjusting the levels of both inverters is provided in the second region 32, and both inverters are connected via the level shifter.

The circuit shown in FIG. 7 is designed such that a signal input to the first region 31 (first circuit block) is output from the second region 32 (second circuit block). Inversely, the circuit may be designed such that the signal input to the second region 32 (second circuit block) is output from the first region 31 (first circuit block). In this case, too, the level shifter is normally provided between both circuit blocks.

Another example of the specific structure of the semiconductor IC device according to the present invention will now be described with reference to FIGS. 8 and 9. In this example, an inverter comprising a MOSFET and a single electron transistor both formed on a surface silicon layer and a conventional CMOS inverter formed on a bulk Si substrate are formed in combination on the same SOI substrate.

Figure 8:
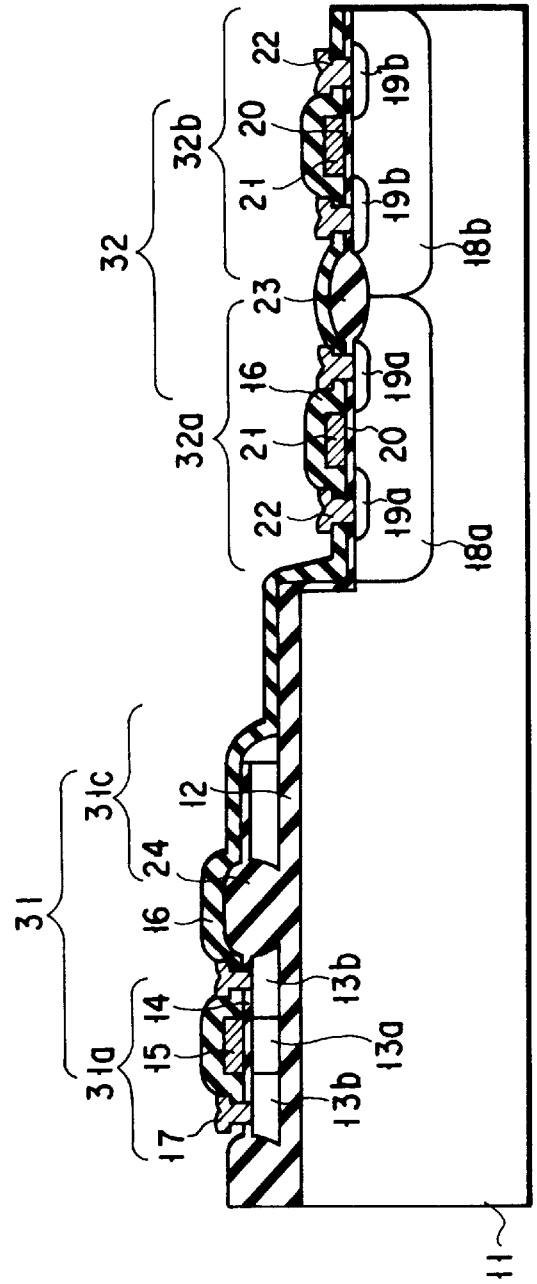
FIG. 8 shows another example of the specific structure of the semiconductor IC device according to the present invention.

FIG. 8 is a cross-sectional view showing the structure of the semiconductor IC circuit. The structural elements corresponding to those in FIG. 6 are denoted by like reference numerals, and the description of the example of FIG. 6 should be referred to regarding the common parts.

The example of FIG. 8 differs mainly from that of FIG. 6 in that a side-wall single electron transistor 31c is formed in the first region 31 and a LOCOS device isolation 24 is provided in the first region 31. The side-wall single electron transistor will be described later. This, however, is also described in detail in the specification and drawings of Japanese Patent Application No. 8-191759, 7-56907 or 7-185871.

Figure 9:
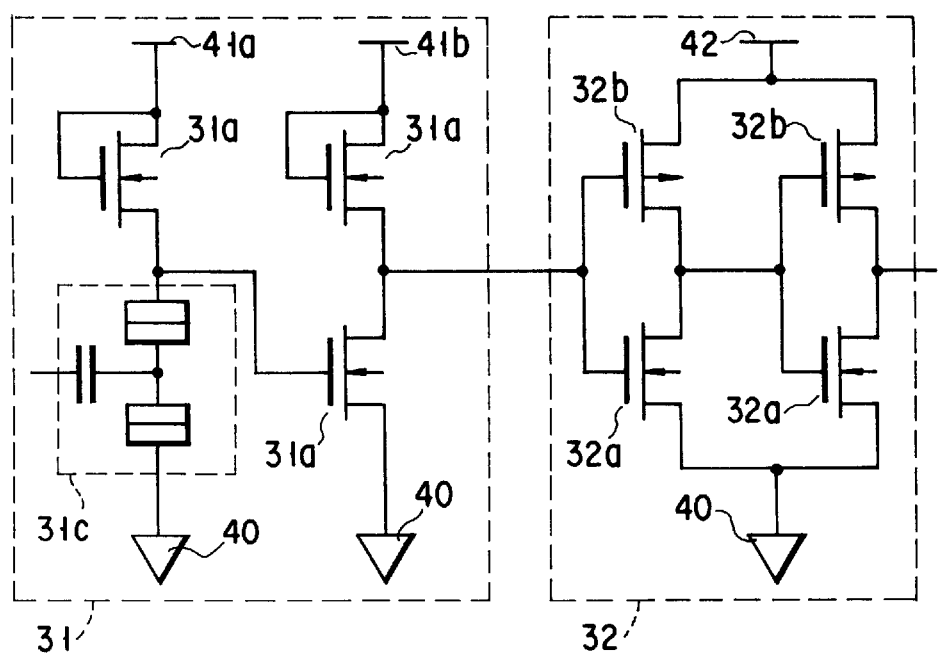
FIG. 9 shows an example of a circuit configuration obtained from the structure shown in FIG. 8.

FIG. 9 shows an example of a circuit configuration of the semiconductor IC circuit obtained from the structure shown in FIG. 8. The first region 31 (first circuit block) includes an inverter comprising the nMOSFET 31a and single electron transistor 31c shown in FIG. 8 and an inverter comprising two nMOSFETs 31a shown in FIG. 8. A power-supply voltage of, e.g. several mV is applied across the inverter comprising the nMOSFET 31a and single electron transistor 31c between a reference potential section 40 and a power supply section 41a. A power-supply voltage of, e.g. 1 V is applied across the inverter comprising the two nMOSFETs 31a between the reference potential section 40 and a power supply section 41b.

Two CMOS inverters comprising nMOSFETs 32a and pMOSFETs 32b, as shown in FIG. 8, are formed in the second region 32 (second circuit block). A power-supply voltage of, e.g. 3.3 V is applied between the reference potential section 40 and a power-supply section 42 of the CMOS inverters.

In the example shown in FIG. 9, in the first region 31 (first circuit block), the inverter comprising the nMOSFET 31a and single electron transistor 31c, is directly connected to the inverter comprising the two nMOSFETs 31a. In general, however, a level shifter for adjusting the levels of both inverters is provided, and both inverters are connected via the level shifter.

In the example shown in FIG. 9, the inverters formed in the first region 31 (first circuit block) are directly connected to the inverters formed in the second region 32 (second circuit block). In general, however, a level shifter for adjusting the levels of both inverters is provided in the second region 32, and both inverters are connected via the level shifter.

In addition, the circuit shown in FIG. 9 is designed such that a signal input to the first region 31 (first circuit block) is output from the second region 32 (second circuit block). Inversely, the circuit may be designed such that the signal input to the second region 32 (second circuit block) is output from the first region 31 (first circuit block). In this case, it is desirable that in the first region 31 (first circuit block) both inverters be connected such that the output of the inverter comprising the two nMOSFETs 31a is input to the inverter comprising the nMOSFET 31a and single electron transistor 31c.

FIGS. 10A to 10G show examples of the steps for manufacturing the semiconductor IC device shown, for example, in FIG. 8 according to the present invention. Specifically, LOCOS device isolations are provided for the devices formed both on the surface silicon layer and bulk Si substrate. The structural elements corresponding to those in FIG. 8 are denoted by like reference numerals.

Figure 10A:
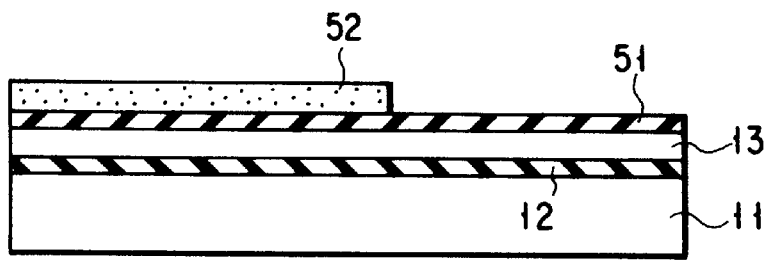
FIGS. 10A to 10G show examples of the steps for manufacturing the semiconductor IC device according to the present invention.

An SIMOX substrate or a bonding SOI substrate is provided, wherein a buried insulating film 12 of a silicon oxide film is formed on a silicon substrate 11, and a surface silicon layer 13 of a single crystal silicon is formed on the buried insulating film 12. The surface silicon layer 13 is oxidized to form a silicon oxide film 51 with a thickness of about 100 nm. Then, a photoresist 52 for masking a region corresponding to the first region is formed (FIG. 10A).

Figure 10B:
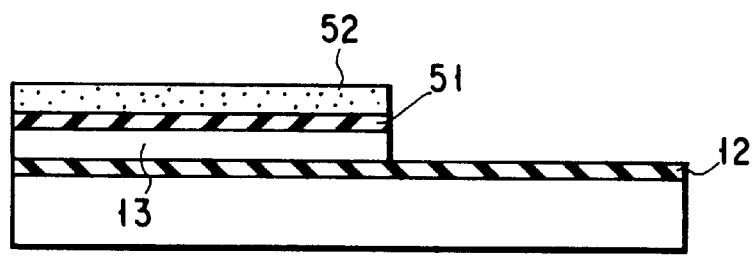

The SOI substrate is situated within an RIE apparatus, and the silicon oxide film 51 is removed by using a reactive gas such as $CHF_3$, with the photoresist 52 used as a mask. Further, a reactive gas such as HBr is used to remove the surface silicon layer 13 (FIG. 10B).

Figure 10C:
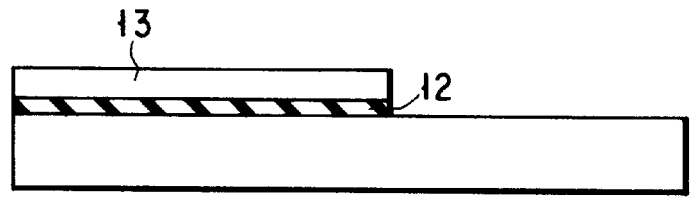

After the photoresist is removed, the SOI substrate is immersed, for examples, in a buffered hydrofluoric acid solution. Thus, the silicon oxide film 51 on the surface silicon layer 13 and the exposed buried oxide film 12 on the bulk Si substrate 11 are removed (FIG. 10C).

Figure 10D:
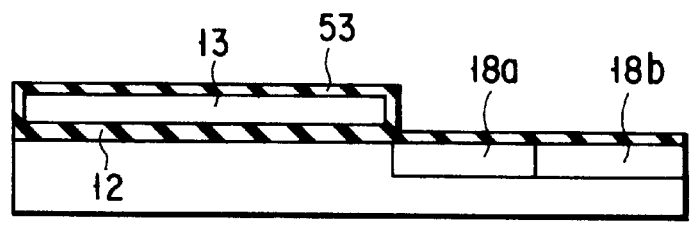

Then, the surface of the substrate is oxidized, and an oxide film 53 with a thickness of about 50 nm is formed. Subsequently, an n-well 18a and a p-well 18b are formed by means of ion implantation (FIG. 10D).

Figure 10E:
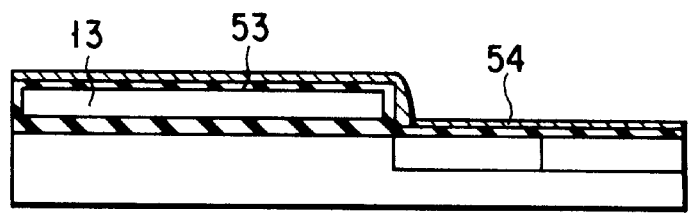

A silicon nitride film 54 is deposited on the oxide film 53 by means of low-pressure CVD, etc (FIG. 10E).

Figure 10F:
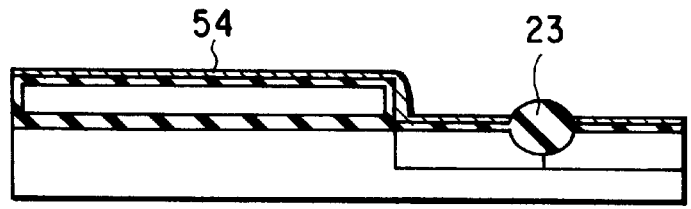

Thereafter, in order to form a device isolation region on the bulk Si substrate 11, an opening pattern is formed by using a photoresist (not shown) and the silicon nitride film 54 is partially removed. The remaining silicon nitride film 54 is used as a mask to carry out oxidation. Thus, a LOCOS device isolation 23 is formed on the bulk Si substrate 11 (FIG. 10F).

Figure 10G:
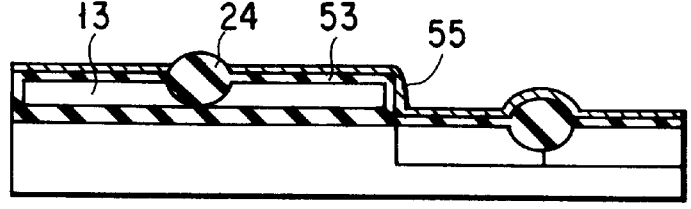

Then, a silicon nitride film 55 is deposited by means of low-pressure CVD, etc. Subsequently, in order to form a device isolation region on the surface silicon layer 13, an opening pattern is formed by using a photoresist (not shown) and the silicon nitride film 55 is partially removed. The remaining silicon nitride film 55 is used as a mask to oxidize the surface silicon layer 13. Thus, a LOCOS device isolation 24 is formed on the surface silicon layer 13 (FIG. 10G).

The LOCOS device isolations are formed in two separate steps since optimal thicknesses of the device isolation oxide films are different between the devices on the surface silicon layer and those on the bulk si substrate 11.

Following the above steps, the steps for fabricating a conventional silicon MOSFET are performed on the surface silicon layer 13 and bulk Si substrate 11, and the steps for fabricating the side-wall single electron transistor are performed on the surface silicon layer 13. Thus, the structure as shown in FIG. 8 is obtained.

An example of the side-wall single electron transistor will now be described with reference to FIGS. 12 to 15. The details of the side-wall single electron transistor are described in the specification and drawings of Japanese Patent Application No. 8-191759.

FIG. 12 is a bird's eye view of an example of the structure of the side-wall single electron transistor. Specifically, an insulating film layer 102 is formed on a semiconductor substrate 101 (SOI substrate), and a semiconductor thin-film layer such as silicon is formed on the insulating film layer 102. A channel is formed at a side-wall portion of a silicon thin-film layer 107 (see FIGS. 13 to 15) by voltage control by a gate electrode 113. The silicon thin-film layer is a partial thin film formed in a semiconductor film layer 109. The silicon thin-film layer adjoins the gate electrode 113 immediately below electron concentration control means 111, with a gate insulating film 114 interposed. The electron concentration control means comprises two electron concentration control electrodes 111 patterned by means of electron line patterning. The electron concentration control electrodes 111 controls the extension of a depletion layer within the silicon thin-film layer 107, and thus a junction area of a tunnel junction can be controlled. Source/drain regions 116 and 117 (see FIGS. 13 to 15) are formed in the silicon thin-film layer 107 by means of the two electron concentration control electrodes 111. Reference numeral 108 denotes a device isolation region, and 114 a gate insulation film formed at a side wall portion of the silicon thin-film layer.

The area of a tunnel junction and the size of an intermediate electrode will now be described. The thickness of the silicon thin-film layer 107 can be controlled to 5 nm or less by means of thermal oxidation of the surface. If the thickness of an inversion layer formed in the silicon thin-film layer 107 by means of the electron concentration control electrode 111 and gate electrode 113 is about 10 nm or less, the junction area of about 50 nm$^2$ or less is obtained. The capacitance of an intermediate electrode formed between two tunnel junctions is determined by a product of the thickness of the silicon thin-film layer, the thickness of the inversion layer, and the distance between the two electron concentration control electrodes 111. The two electron concentration control electrodes 111 for forming a tunnel barrier can be reduced to a width of 50 nm at an interval of 50 nm by means of electron patterning technique. Accordingly, the distance between the two electron concentration control means 111 becomes 50 nm or less in consideration of the extension of the depletion layer. That is, the total capacitance of the series-connected two tunnel junctions and the intermediate electrode can be reduced to 2 af or less.

Since the extension of the depletion layer on the surface side of the channel layer can be freely controlled by the electron concentration control means, it is possible to form the tunnel barrier or to freely control the height of the tunnel barrier.

A process of fabricating the side-wall single electron transistor shown in FIG. 12 will now be described with reference to FIGS. 13A to 13D, 14A to 14C, and 15A and 15B. In these figures, A-A' and A1-A1' cross sections correspond to the cross sections taken along lines An-An' in FIG. 12, and B-B', B1-B1' and B2-B2' cross sections correspond to the cross sections taken along line Bn-Bn' in FIG. 12.

As is shown in the cross-sectional view of FIG. 13A, a thin oxide film layer 104 is formed by thermal oxidation on an SOI substrate which is constructed such that an insulating layer 102 is formed on a semiconductor substrate 101 formed of, e.g. silicon and a semiconductor film layer 103 formed of, e.g. silicon is formed on the insulating film layer 102. An oxidation preventing film 105 such as a silicon nitride film is formed, by a lithographical step and an etching step such as RIE, over the semiconductor film layer 103 excluding a thin-film formation region of the layer 103. Then, as is shown in FIG. 13A, an upper region of the silicon film layer, which is surrounded by the oxidation preventing film 105, is selectively thermal-oxidized to form an oxide film 106. If the temperature, time, oxidizing atmosphere for the thermal oxidation are controlled, the thickness of a silicon thin-film layer 107 which will become a channel region can be controlled to, e.g. about 5 nm.

Then, the oxidation preventing film 105 and oxide film 106 are successively removed by means of wet etching, etc., and the silicon thin-film layer 107 is exposed, as shown in FIG. 13B. Then, as shown in FIG. 13C, a device isolation film 108 for electrically insulating adjacent devices is formed by means of LOCOS, STI, etc. FIG. 13D is a plan view of the structure shown in FIG. 13C. A device region 109 is surrounded by the device isolation region 108, and the silicon thin-film layer 107 is formed at a central portion of the device region 109.

Figure 14A:
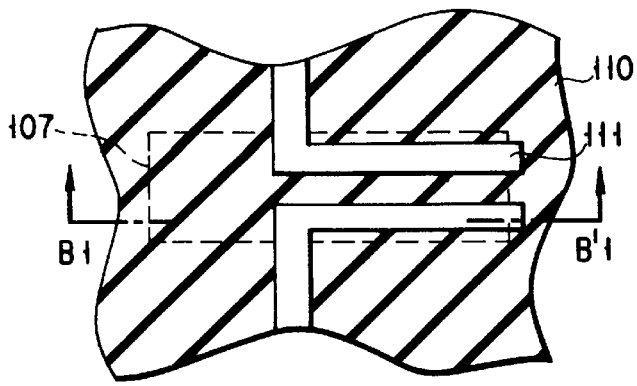
FIGS. 14A to 14C show part of the steps of manufacturing the single electron transistor shown in FIG. 12.
Figure 14B:
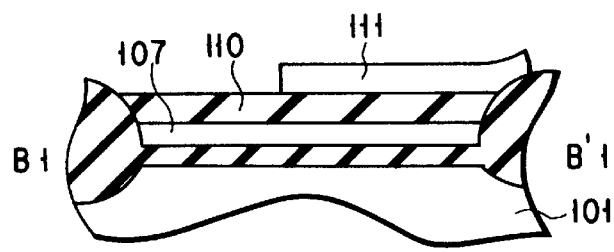
Figure 14C:
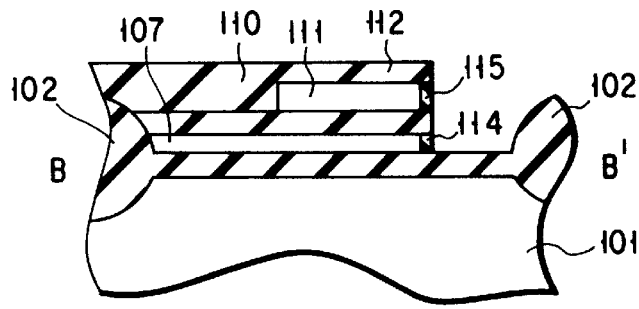

Subsequently, as shown in the plan view of FIG. 14A, an insulating film 110 such as an oxide film is formed on the surface of the device region 109 by means of thermal oxidation or CVD. In this case, too, if the temperature, time, oxidizing atmosphere for the thermal oxidation are controlled, the thickness (channel width) of the silicon thin-film layer in which the channel region is formed can be controlled on the order of nm. Then, as is shown in FIG. 14A, electron concentration control electrodes 111 formed of conductors such as poly-crystal silicon with a thickness of about 100 nm are formed over the thin-film region, with the insulating film layer 110 interposed. At this time, if narrow electron concentration control electrodes each having a width of about 50 nm are formed at an interval of about 50 nm, a lithographic technique using electron patterning and an anisotropic etching step such as RIE are performed. It is preferable to form the electron concentration control electrodes 111 on the insulating film layer 110 by this method, rather than by a deposition method (e.g. direct vacuum deposition), in consideration of the processing controllability, etc. FIG. 14B is a cross-sectional view taken along line B1-B1' in FIG. 14A.

Subsequently, an insulating film 112 for covering the electron concentration control electrodes 111 is formed, and portions of the insulating film 112, electron concentration control electrodes 111, insulating film 110 and silicon film layer 107 are successively etched to expose the side wall of the silicon film layer 107. Then, as shown in a B-B' cross section of FIG. 14C, a gate insulation film 114 such as an oxide film is formed on the side wall of the electron concentration control electrode 111 and the side wall of the silicon thin-film layer 107 by means of thermal oxidation. In this case, the gate insulation film 114 is formed simultaneously with the insulating film 115. However, there is no need to form the gate insulation film 114 and insulation film 115 at the same time, if a gate electrode 113, which will be formed later, is insulated and separated from the electron concentration control electrode 111.

Figure 15A:
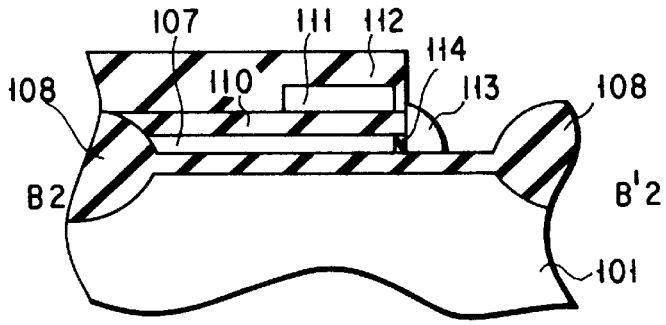
FIGS. 15A and 15B illustrate part of the steps of manufacturing the single electron transistor shown in FIG. 12.

Then, as shown in a B2-B2' cross section of FIG. 15A, a gate electrode 113 adjoining via the gate insulating film 114 the silicon thin-film layer 107 in which the channel is to be formed is formed by using a technique for leaving a side wall. The bird's eye view of FIG. 12 shows the state in which the insulating film 112 is removed from the structure shown in FIG. 15A.

Figure 15B:
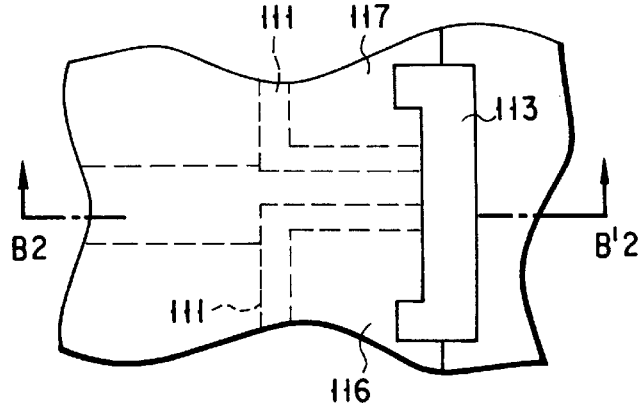

Thereafter, as shown in the plan view of FIG. 15B, source/drain regions 116 and 117 are formed by ion implantation, etc. so as to sandwich the two electron concentration control electrodes 111. Ion impurities to be introduced are, for example, boron in the case of p-conductivity type, and phosphorus or arsenic in the case of n-conductivity type.

Subsequently, an interlayer isolation film (not shown) for covering the device region is formed, and an opening communicating with the gate electrode and source/drain electrode is formed. Further, metal wiring of aluminum, copper, etc. is formed. Thus, the side-wall single electron transistor as shown in FIG. 14 is obtained.

The steps of fabricating the semiconductor IC device as shown, e.g. in FIG. 6 will now be described with reference to FIGS. 11A to 11E. In this device, mesa type device isolation is used for devices on the surface silicon layer, and LOCOS device isolation is used for devices on the bulk Si substrate. The steps up to some stage are common between FIG. 11 and FIG. 14. Thus, the elements common to those shown in FIG. 10 are denoted by like reference numerals.

Figure 11A:
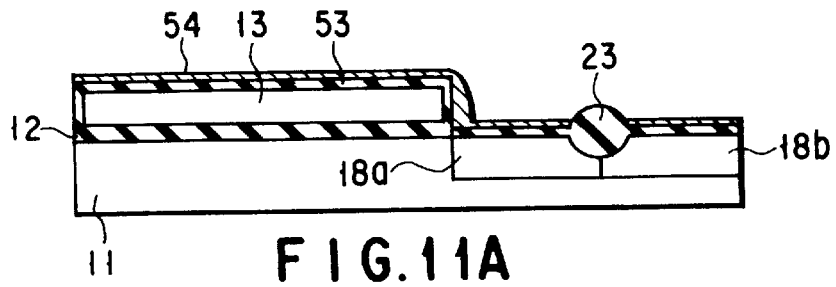
FIGS. 11A to 11E show other examples of the steps for manufacturing the semiconductor IC device according to the invention.

Following the step of FIG. 10E, an opening pattern is formed by using a photoresist (not shown) in order to form a device isolation region on the bulk Si substrate 11, and the silicon nitride film 54 is partially removed. Then, using the remaining silicon nitride film 54 as a mask, oxidation is carried out and a LOCOS device isolation 23 is formed on the bulk Si substrate (FIG. 11A).

Figure 11B:
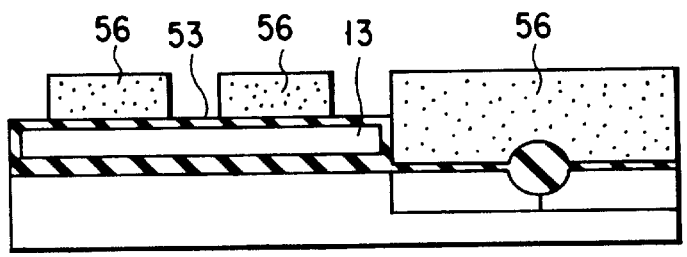

The silicon nitride film 54 is removed by an RIE apparatus by using a reactive gas such as CF4. Then, a photoresist 56 is formed as a mask for forming a mesa type device isolation (FIG. 11B).

Figure 11C:
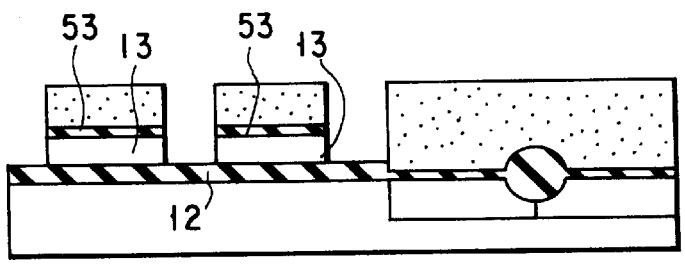

Subsequently, the silicon oxide film 53 is removed within, e.g. the reactive ion etching (RIE) apparatus by using a reactive gas such as $CHF_3$, and the surface silicon layer 13 is then removed by using a reactive gas such as HBr (FIG. 11C).

Figure 11D:
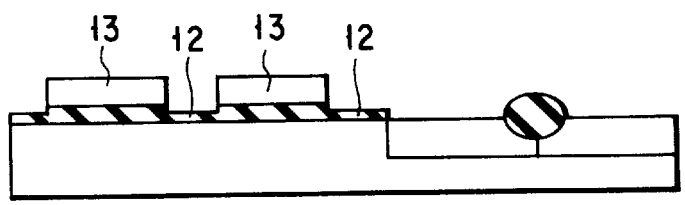

After the photoresist 56 is removed, the SOI substrate is immersed in a buffered hydrofluoric acid solution so that the buried oxide film 12 on the exposed surface may be removed (FIG. 11D)

Figure 11E:
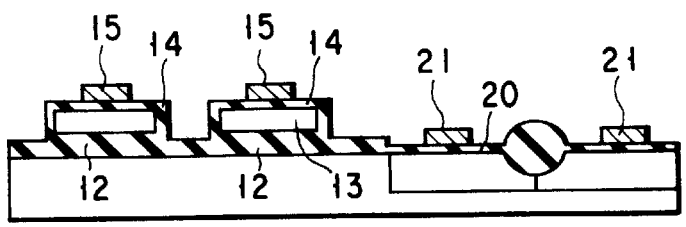

Gate oxide films 14 and 20 are formed on the bulk Si substrate 11 and surface silicon layer 13, and then gate electrodes 15 and 21 are formed on the gate oxide films 14 and 20 (FIG. 11E).

Following the above steps, steps for fabricating a conventional MOSFET are performed on the surface silicon layer 13 and bulk Si substrate 11. Thus, the structure as shown in FIG. 6 is obtained.

In the meantime, the steps for fabricating the side-wall single electron transistor may be performed on the surface silicon layer 13, whereby the same semiconductor IC device as shown in FIG. 8 is obtained.

Figure 16:
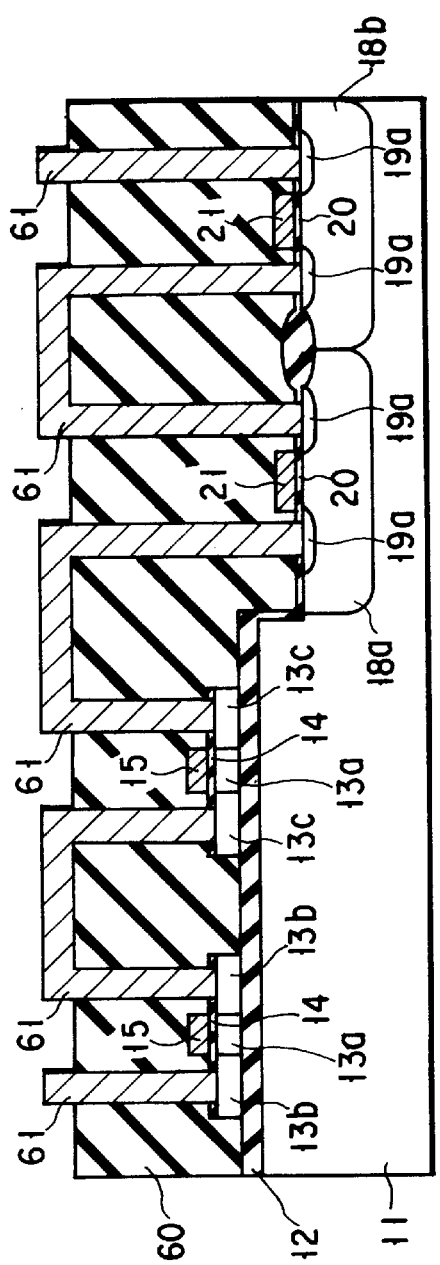
FIG. 16 shows still another example of the specific structure of the semiconductor IC device according to the present invention.

FIG. 16 is a cross-sectional view showing the structure of a semiconductor IC device according to an embodiment of the invention. The elements common to those in FIG. 6 are denoted by like reference numerals. As is shown in FIG. 16, gate electrodes 20 are formed by the steps illustrated in FIGS. 10 and 11, and S/D ion implantation is carried out. Then, an oxide film 60 which has a thickness of, e.g. 5000 Å and becomes an interlayer insulating film is deposited by, e.g. LPCVD (Low Pressure Chemical Vapor Deposition). Then, the surface of the resultant structure is flattened by CMP (Chemical Mechanical Polishing), and contact holes are formed by RIE (Reactive Ion Etching), etc. Electrode material 61 such as tungsten is filled in the contact holes. Wiring of Al, Cu, etc. is provided on the upper surface of the structure. Thus, the semiconductor IC device as shown in FIG. 16 is obtained.

Figure 17:
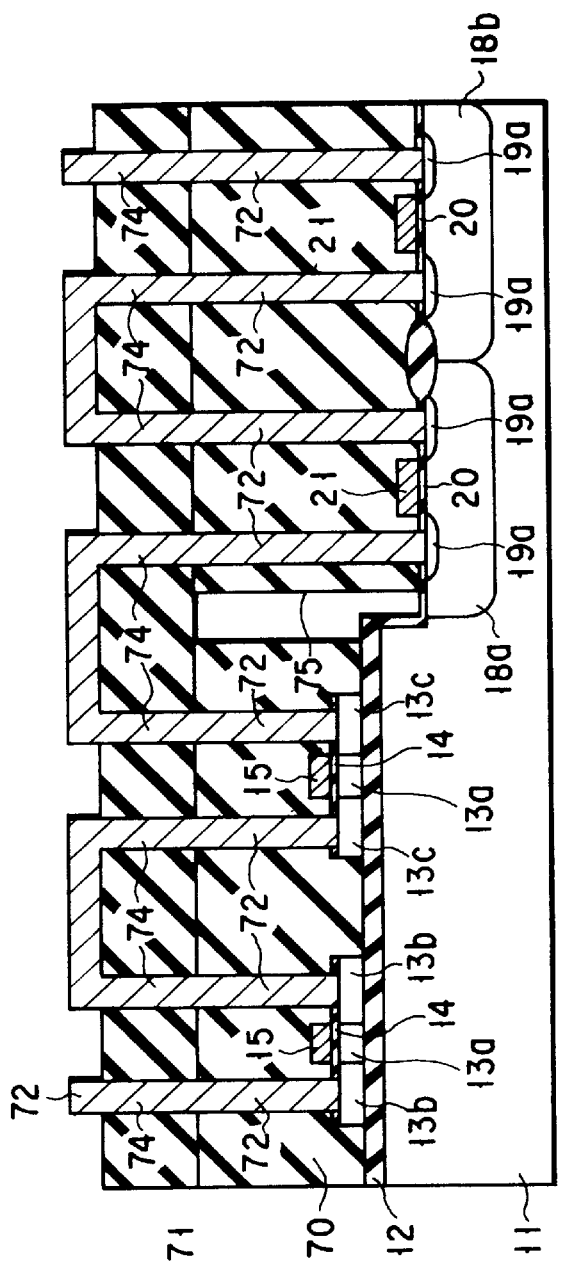
FIG. 17 shows still another example of the specific structure of the semiconductor IC device according to the present invention.

With reference to FIG. 17 in which the elements common to those in FIG. 6 are denoted by like reference numerals, a semiconductor IC device according to an embodiment of the invention will now be described. In the semiconductor IC device of this embodiment, electrical insulation between the silicon layer and the semiconductor substrate can be made almost complete. Gate electrodes 20 are formed by the steps illustrated in FIGS. 10 and 11, and S/D ion implantation is carried out. Then, an oxide film 70 which has a thickness of, e.g. 5000 Å and becomes an interlayer insulating film is deposited by, e.g. LPCVD. Then, the surface of the resultant structure is flattened by CMP, and contact holes are formed by RIE, etc. at boundaries between silicon layers 13b and 13c and semiconductor substrate 11. Then, an oxide film 71 with a thickness of, e.g. 100 Å is deposited for electrical insulation between the silicon layers 13b and 13c and semiconductor substrate 11.

Subsequently, electrode material 72 such as tungsten is filled in the contact holes. Then again, an oxide film 73 with a thickness of, e.g. 1000 Å is deposited by means of plasma CVD, etc. Contact holes for contact with the S/D electrodes of the semiconductor devices or the gate electrode regions are formed in the deposited oxide film 73. Electrode material 74 such as tungsten is filled in the contact holes. Wiring of Al, Cu, etc. is provided on the upper surface of the structure. Thus, the semiconductor IC device as shown in FIG. 17 is obtained.

With the above structure, the silicon layer 13c is electrically shielded from the semiconductor substrate 11 by the electrode 75 at the boundary between the silicon layer 13c and semiconductor substrate 11. Thus, the highly reliable semiconductor IC device is obtained. In order to completely keep the electrical isolation between the silicon layer 13c and the semiconductor 11, it is desirable that electrode 75 between the silicon layer 13c and the semiconductor 11 is grounded.

As has been described above, in the semiconductor IC device of the present invention, the semiconductor device formed on the semiconductor substrate can completely be electrically isolated from the semiconductor device formed on the silicon layer.

Therefore, a device such as a single electron transistor with a lower power-supply voltage than a CMOS device (a device with a low noise margin or an input/output signal level) and a device such as a conventional CMOS device with a high power-supply voltage (a device with a high noise margin or an input/output signal level) can be provided on the same substrate while their respective characteristics are not deteriorated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. The semiconductor integrated circuit (IC) device having a silicon-on-insulator substrate comprising a semiconductor substrate, an insulating film formed on the semiconductor substrate, and a silicon layer formed on the insulating film, the semiconductor IC device comprising:

a semiconductor device formed on the semiconductor substrate; and a single electron device formed on the silicon layer and constituted by a conductor island;

wherein when a coupling capacitance of the conductor island constituting and the semiconductor substrate is C and a power-supply voltage for the semiconductor device on the semiconductor substrate is V, the value of C X V is sufficiently lower than elemental charge e, and wherein side surfaces of the insulating film and the silicon layer are covered with conductive material.

2. The semiconductor IC device according to claim 1, wherein the power-supply voltage for the semiconductor device formed on the semiconductor substrate is higher than that for the single electron device formed on the silicon layer.

3. The semiconductor IC device according to claim 1, further comprising at least one MOS type field-effect transistor formed on the silicon layer.

4. The semiconductor IC device according to claim 3, wherein the power-supply voltage for the MOS type field-effect transistor formed on the silicon layer is higher than that for the single electron device formed on the silicon layer.

5. The semiconductor IC device according to claim 3, wherein the semiconductor device formed on the semiconductor substrate is disposed near a semiconductor integrated circuit including the MOS type field-effect transistor formed on the silicon layer.

6. The semiconductor IC device according to claim 1, wherein the semiconductor device formed on the semiconductor substrate is disposed near a semiconductor integrated circuit including the single electron device formed on the silicon layer.

7. The semiconductor IC device according to claim 6, wherein the semiconductor device formed on the semiconductor substrate and the single electron device on the silicon layer are connected to each other via a MOS type field-effect transistor formed on the silicon layer.

8. The semiconductor IC device according to claim 1, further comprising a step-down voltage circuits, a step-up voltage circuits, an amplifying circuit and a pulse generating circuit which are provided on the semiconductor substrate and are supplied with a power-supply voltage from an external power supply.

9. The semiconductor IC device according to claim 1, wherein the potential of the conductive material is set at a ground level.

10. The semiconductor IC device according to claim 1, wherein the single electron device formed on the silicon layer is operated with a power-supply voltage different from a power supply voltage for the semiconductor device formed on the semiconductor substrate.

11. The semiconductor IC device according to claim 10, wherein the power-supply voltage for the single electron device formed on the silicon layer is less than $1/100$ that for the semiconductor device formed on the semiconductor substrate.

* * * * *